United States Patent
Takahashi

(10) Patent No.: US 6,285,440 B1
(45) Date of Patent: *Sep. 4, 2001

(54) ILLUMINATION SYSTEM AND PROJECTION EXPOSURE APPARATUS USING THE SAME

(75) Inventor: Kazuhiro Takahashi, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,165

(22) Filed: Oct. 14, 1998

(30) Foreign Application Priority Data

Oct. 14, 1997 (JP) .................................................. 9-296359

(51) Int. Cl.$^7$ ........................... G03B 27/54; G03B 27/72; F21V 29/00
(52) U.S. Cl. ................................. 355/67; 355/71; 362/268
(58) Field of Search ................... 355/67, 53, 71; 356/399, 400; 362/268

(56) References Cited

U.S. PATENT DOCUMENTS

| | | | | |
|---|---|---|---|---|
| 4,682,885 | * | 7/1987 | Torigoe | 355/67 |
| 5,194,959 | * | 3/1993 | Kaneko et al. | 348/335 |
| 5,253,110 | * | 10/1993 | Ichihara et al. | 359/619 |
| 5,309,198 | * | 5/1994 | Nakagawa | 355/67 |
| 5,459,547 | * | 10/1995 | Shiozawa | 355/67 |
| 5,621,499 | * | 4/1997 | Shiozawa | 355/67 |
| 5,713,660 | * | 2/1998 | Mori et al. | 362/268 |
| 5,790,239 | * | 8/1998 | Komatsuda et al. | 355/67 |
| 5,891,806 | * | 4/1999 | Shibuya et al. | 437/707 |
| 5,926,257 | * | 7/1999 | Mizouchi | 355/67 |

FOREIGN PATENT DOCUMENTS

| | | |
|---|---|---|
| 4-78002 | 3/1992 | (JP) . |
| 8-203807 | 8/1996 | (JP) . |

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

An illumination system for illuminating an illumination region having a difference in size along a first direction and a second direction perpendicular to the first direction. The illumination system includes an optical integrator having elements with different refractive powers with respect to the first and second directions as the optical integrator is viewed in an optical axis direction, the elements also having the same pitch with respect to the first and second directions, and an optical device for directing light from a light source upon the optical integrator at different largest incidence angles with respect to the first and second directions, so as to satisfy a relation $$0.8 < [(\tan\theta_1/\tan\theta_2)/(\phi_1/\phi_2)] < 1.2$$

where $\phi_1$ and $\phi_2$ are largest incidence angles of the light incident on the optical integrator with respect to the first and second directions, and $\phi_1$ and $\phi_2$ are refractive powers of the optical integrator with respect to the first and second directions.

15 Claims, 9 Drawing Sheets

ILLUMINATION SYSTEM AND PROJECTION EXPOSURE APPARATUS USING THE SAME

FIELD OF THE INVENTION AND RELATED ART

This invention relates to an illumination system and a projection exposure apparatus using the same. More particularly, the invention is concerned with an illumination system and a projection exposure apparatus suitable for use in the manufacture of micro-structure devices such as an IC, LSI, a magnetic head, a liquid crystal panel, or a CCD, for example. Specifically, the invention is directed to a projection exposure apparatus of a step-and-repeat type or step-and-scan type for device manufacture, wherein a pattern of a reticle can be efficiently illuminated and high resolution can be provided easily.

Many proposals have been made upon a reduction type projection exposure apparatus (stepper), in micro-fabrication of semiconductor devices such as an IC or LSI, with which apparatus an image of a circuit pattern of a mask (reticle) is formed on a photosensitive substrate (wafer) through a projection optical system and this is repeated so that the photosensitive substrate is exposed in a step-and-repeat method.

In such steppers, the pattern transfer is performed by projecting a circuit pattern of a reticle to a predetermined position on a wafer surface in a reduced scale, with a projection optical system having a predetermined reduction magnification. After completion of a single pattern projection and transfer, a stage on which the wafer is placed is moved stepwise by a predetermined amount, and the pattern transfer is repeated. This procedure is repeated until exposure of the whole wafer surface is completed.

On the other hand, step-and-scan (scan type) projection exposure apparatuses have recently been proposed, in which a scanning mechanism is used to assure higher resolution and enlargement of picture field size. In such a step-and-scan type projection exposure apparatus, a slit-like illumination region is defined and, for exposure, a reticle and a wafer are scanned by relatively scanning the reticle and the wafer relative to the slit-like illumination region, whereby exposure of one shot is performed. After completion of scan exposure of one shot, the wafer is moved stepwise to the exposure position for the subsequent shot. Then, exposure of this shot is performed. This is repeated until exposure of the whole wafer surface is completed.

In scan type projection exposure apparatuses, the exposure operation is performed while scanning a reticle and a wafer in synchronism with each other. The illumination region upon the reticle surface has a rectangular shape being short in the scan direction and being long in the non-scan direction. For a method of efficiently illuminating such an oblong shape, Japanese Laid-Open Patent Application, Laid-Open No. 203807/1996 proposes a system having a fly's eye lens as an optical integrator for collecting light from a light source and for defining secondary light sources, wherein the section thereof has a shape analogous to the shape of the illumination region. On the other hand, Japanese Laid-Open Patent Application, Laid-Open No. 78002/1992 proposes a structure wherein an optical integrator is provided by combinations of cylindrical lenses disposed on an optical axis.

FIGS. 13A and 13B are schematic views for illustrating a main portion of an illumination system as proposed in Japanese Published Patent Application, Publication No. 78002/1992. In FIG. 13A, light from a light source 21 is reflectively collected by an elliptical mirror 22 toward an optical integrator 6 which comprises four lens assemblies 6a–6c. With lights from secondary light sources as defined by this optical integrator, the surface R to be illuminated is illuminated through a condenser lens 8. As shown in FIG. 13B, there are secondary light source images of elliptical shape defined upon the light exit surface of the optical integrator 6.

However, when a fly's eye lens is used as an optical integrator and when the sectional shape of the lenses of the fly's eye lens is rectangular, there occurs a difference of pitch in disposition of secondary light sources with respect to X and Y directions. This results in a difference in resolution performance between a pattern in the X direction and a pattern in the Y direction.

Further, when a fly's eye lens having combinations of cylindrical lenses disposed along the optical axis direction is used, as illustrated in FIG. 13B, if the incidence angle of the light from the light source incident on the fly's eye lens is isometric, the shape of the secondary light source within a single lens element 60 as defined by intersection of the cylindrical lenses as viewed in the Z direction is deformed due to a difference in refractive power depending on the direction, even when the disposition of the cylindrical lens assemblies is even with respect to the X and Y directions. This results in a difference with direction, in the shape of the whole secondary light sources with respect to the X and Y directions.

SUMMARY OF THE INVENTION

It is an object of the present invention to provide an illumination system and/or a projection exposure apparatus by which no difference is created in shape or disposition of secondary light sources with respect to the X and Y directions.

In accordance with an aspect of the present invention, there is provided an illumination system for illuminating an illumination region having a difference in size along a first direction and a second direction perpendicular to the first direction, said illumination system comprising: an optical integrator for receiving light from a light source, said optical integrator including elements having different refractive powers being different with respect to the first and second directions as said optical integrator is viewed in an optical axis direction, said elements also having the same pitch with respect to the first and second directions, wherein said illumination system satisfies a relation $$0.8 < [(\tan \theta_1/\tan \theta_2)/(\phi_1/\phi_2)] < 2.1$$

where $\theta_1$ and $\theta_2$ are largest incidence angles of the light incident on said optical integrator with respect to the first and second directions, and $\phi_1$ and $\phi_2$ are refractive powers of said optical integrator with respect to the first and second directions.

In accordance with another aspect of the present invention, there is provided an illumination system for illuminating an illumination region having a difference in size along a first direction and a second direction perpendicular to the first direction, said illumination system comprising: an optical integrator for receiving light from a light source, said optical integrator including elements having different refractive powers being different with respect to the first and second directions as said optical integrator is viewed in an optical axis direction, said elements also having the same pitch with respect to the first and second directions, wherein said illumination system satisfies a relation $$0.8 < [(NA_1/NA_2)/(\phi_1/\phi_2)] < 2.1$$

where $NA_1$ and $NA_2$ are numerical apertures of the light incident on said optical integrator with respect to the first and second directions, and $\phi_1$ and $\phi_2$ are refractive powers of said optical integrator with respect to the first and second directions.

In accordance with a further aspect of the present invention, there is provided an illumination system for illuminating an illumination region having a difference in size along a first direction and a second direction perpendicular to the first direction, said illumination system comprising: an optical integrator for receiving light from a light source, said optical integrator having (i) a first lens assembly including cylindrical lenses arrayed at a predetermined pitch along the first direction, said cylindrical lenses of said first lens assembly having a refractive power only with respect the first direction, and (ii) a second lens assembly including cylindrical lenses arrayed at a predetermined pitch along the second direction, said cylindrical lenses of said second lens assembly having a refractive power only with respect to the second direction, wherein said first and second lens assemblies are disposed along the optical axis direction, wherein, when said first and second lens assemblies are viewed in the optical axis direction, said cylindrical lenses of said first and second lens assemblies are mutually intersected to define plural elements having the same pitch with respect to the first and second directions; and wherein said illumination system satisfies a relation $$0.8 < [(\tan\theta_1/\tan\theta_2)/(\phi_1/\phi_2)] < 1.2$$

where $\theta_1$ and $\theta_2$ are largest incidence angles of the light incident on said optical integrator with respect to the first and second directions, and $\phi_1$ and $\phi_2$ are refractive powers of said optical integrator with respect to the first and second directions.

In accordance with a yet further aspect of the present invention, there is provided a projection exposure apparatus comprising: an illumination system as recited above; and a projection optical system for projecting a pattern of a first object as illuminated with said illumination system onto a second object.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
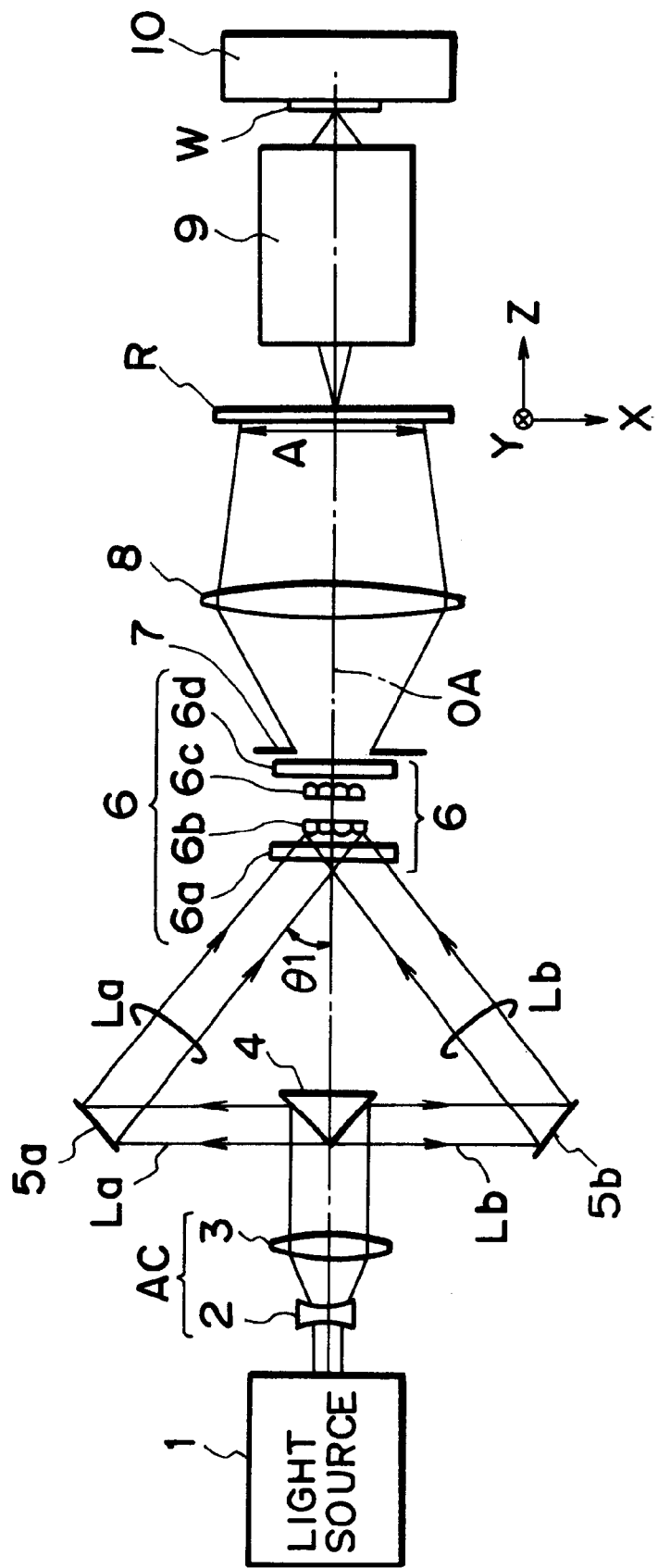
FIG. 1 is a schematic view, along an X-Z section, of a projection exposure apparatus with an illumination system according to a first embodiment of the present invention.
Figure 2:
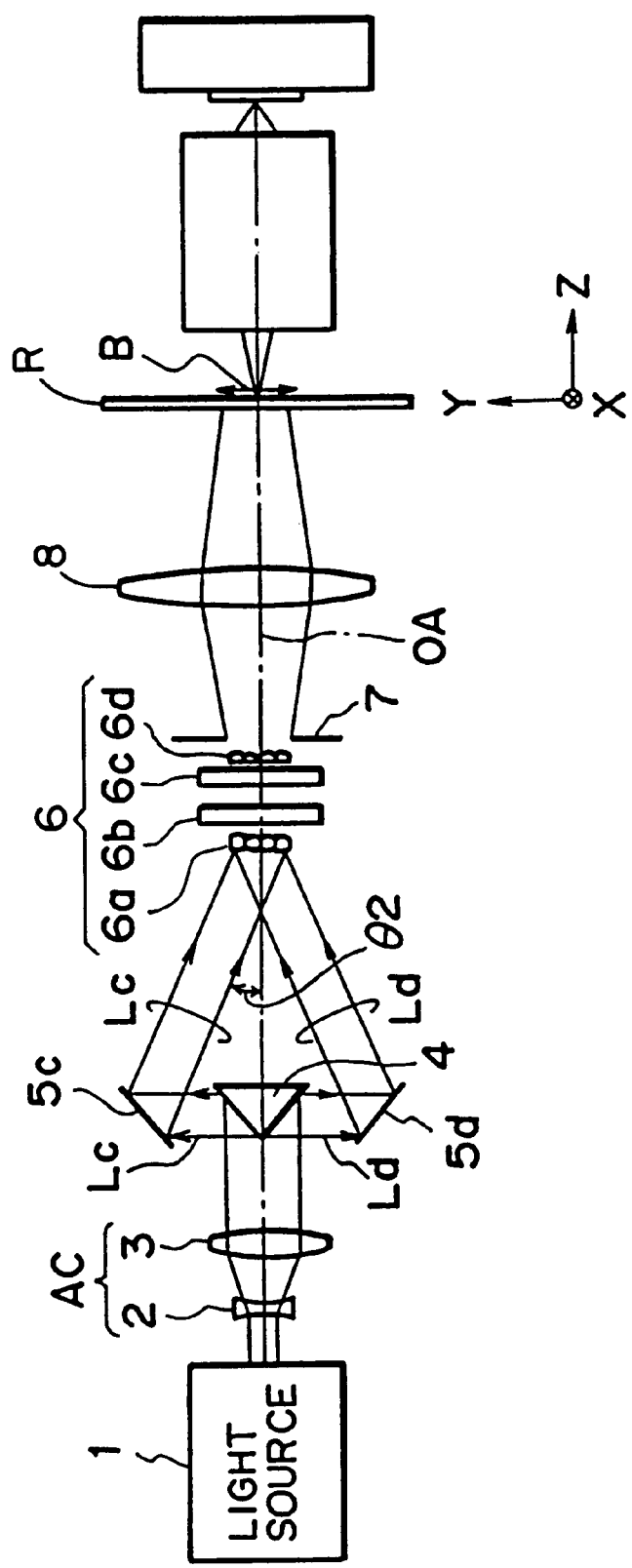
FIG. 2 is a schematic view, along a Y-Z section, of the projection exposure apparatus with the illumination system according to the first embodiment of the present invention.
Figure 3:
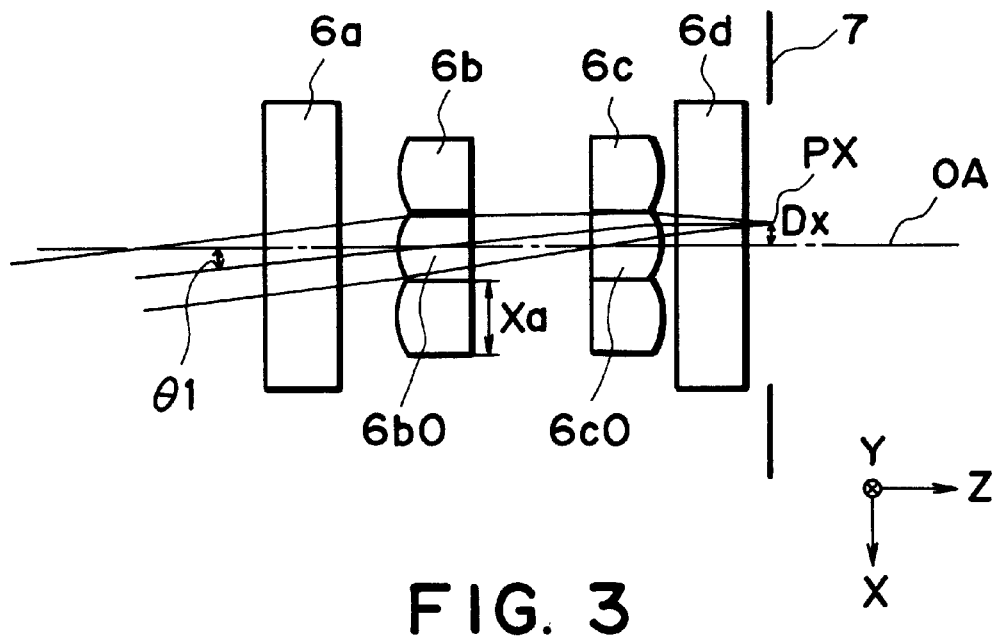
FIG. 3 is an enlarged view of a portion of FIG. 1.
Figure 4:
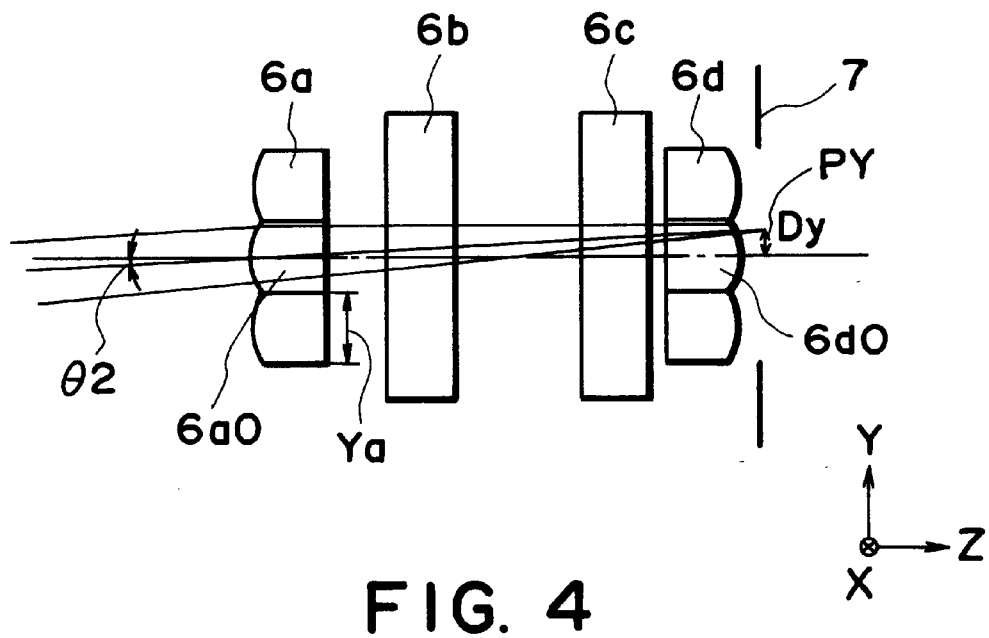
FIG. 4 is an enlarged view of a portion of FIG. 2.

FIG. 1 is a schematic view, along an X-Z section, of a main portion of a projection exposure apparatus with an illumination system according to a first embodiment of the present invention. FIG. 2 is a schematic view, along a Y-Z section, of the projection exposure apparatus of the FIG. 1 embodiment. FIG. 3 is an enlarged view of a portion of FIG. 1, and FIG. 4 is an enlarged view of a portion of FIG. 2.

In this embodiment, the invention is applied to a step-and-repeat or step-and-scan type projection exposure apparatus. Referring first to FIG. 1, details of the structure will be described.

Denoted at 1 is a light source which comprises an excimer laser, for example, and which produces parallel light of a predetermined shape. Denoted at 2 is a concave lens, and denoted at 3 is a convex lens. The concave lens 2 and the convex lens 3 provide an afocal converter AC for transforming the light from the light source into a predetermined shape and for emitting the same. The light thus shaped by the afocal converter AC is reflectively divided by a dividing mirror 4 of a pyramid shape, into four light beams La, Lb, Lc and Ld. FIG. 1 illustrates paths of two light beams La and Lb, of the four light beams, being deflected in an X-Z plane. The paths of the two light beams La and Lb divided by the mirror 4 are then deflected by deflecting mirrors 5a and 5b, respectively. Denoted at 6 is an optical integrator which includes four cylindrical lens assemblies (lens assemblies) each having plural cylindrical lenses arrayed one-dimensionally (along one direction). Here, reference numerals 6a, 6b, 6c and 6d denote these cylindrical lens assemblies (lens assemblies). Each of the cylindrical lens assemblies 6b and 6c comprises cylindrical lenses extending in the Y direction and being disposed along the X direction. These cylindrical lens assemblies have a refracting power with respect to the X-Z plane (X direction or first direction). Cylindrical lens assemblies 6a and 6b each comprises cylindrical lenses extending in the X direction and being disposed along the Y direction. They have a refracting power with respect to the Y-Z plane (Y direction or second direction) perpendicular to the X-Z plane. The light beams La and Lb deflected by the mirrors 5a and 5b are incident on the optical integrator so that the central light rays of them intersect with the optical axis OA in the neighborhood of the light entrance surface of the cylindrical lens assembly 6b, as shown in FIG. 3, and also so that they are projected from opposite sides of the optical axis OA with a predetermined incidence angle $\theta_1$. The light entering the optical integrator 6 produces secondary light sources in the vicinity of the light exit surface (position of the stop 7 or adjacent to it) of the integrator.

Denoted at 7 is a stop for regulating the whole shape of the secondary light sources. Denoted at 8 is a condenser lens for collecting light beams from the secondary light sources as defined in the vicinity of the light exit surface of the optical integrator 6, to illuminate a predetermined range A on a reticle R. Denoted at 9 is a projection optical system for projecting a circuit pattern formed on the reticle R onto the surface of a wafer W. Denoted at 10 is a wafer stage for holding the wafer W and for moving it in the X, Y and Z directions.

The structure along the Y-Z plane shown in FIG. 2 will now be described.

FIG. 2 illustrates paths of two light beams Lc and Ld divided by the mirror 4 and deflected in the Y-Z plane. The two light beams Lc and Ld deflected by the mirror 4 are then deflected by mirrors 5c and 5d, respectively. Then, as shown in FIG. 4, they are projected on the optical integrator so that the central light rays of the light beams Lc and Ld intersect with the optical axis OA in the neighborhood of the light entrance surface of the cylindrical lens assembly 6a. The incidence angle of the light beams Lc and Ld with respect to the optical axis OA is $\theta_2$. These lights are contributable to define secondary light sources in the vicinity of the light exit surface of the optical integrator 6. The light from the secondary light sources is received by the condenser lens 8, to illuminate a range B upon the reticle R.

The cylindrical lenses constituting the cylindrical lens assemblies 6a–6d have the same length with respect to the direction in which they have a refractive power, as viewed in the Z direction. Namely, the cylindrical lenses $6b_0$ and $6c_0$ constituting the cylindrical lens assemblies 6b and 6c have a length Xa in the X direction along the X-Z plane, while cylindrical lenses $6a_0$ and $6d_0$ constituting the cylindrical lens assemblies 6a and 6d have a length Ya in the Y direction along the Y-Z plane, wherein Xa=Ya. Also, the number of cylindrical lenses arrayed in these directions is the same. Thus, when the optical integrator 6 is viewed in the optical axis direction (Z direction), the elements as defined by the intersection of the cylindrical lenses have a square shape, and the number in the X direction is the same as the number in the Y direction.

In this embodiment, when the cylindrical lens assemblies 6b and 6c have a focal length $f_1$ (refractive power $\phi_1$), the cylindrical lens assemblies 6a and 6d have a focal length $f_2$ (refractive power $\phi_2$), and incidence angles (largest incidence angles), along the X-Z plane and Y-Z plane, of the lights upon the optical integrator 6 are $\theta_1$ and $\theta_2$, respectively, the following relation is satisfied:

$$0.8 < [(\tan \theta_1 / \tan \theta_2)/(f_1/f_2)] < 1.2 \quad (1)$$

Namely $$0.8 < [(\tan \theta_1 / \tan \theta_2)/(\phi_1/\phi_2)] < 1.2 \quad (2)$$

FIGS. 3 and 4 illustrate the relation between the light incident on the optical integrator of the first embodiment and the position of the light source upon the plane of the stop 7, with respect to the X-Z plane and Y-Z plane, respectively. In FIG. 3, the parallel light projected, with an incidence angle $\theta_1$, upon one cylindrical lens $6b_0$ which is on the optical axis OA of the cylindrical lens assembly 6b, is collected by the cylindrical lens $6c_0$, also placed on the optical axis as is the cylindrical lens $6b_0$, at a position PX which is on the stop 7 plane and at a distance DX from the optical axis.

Similarly, in FIG. 4, the light projected on the cylindrical lens $6a_0$ with an incidence angle $\theta_2$ is collected by the cylindrical lenses $6a_0$ and $6d_0$, at a position PY which is on the stop 7 plane and at a distance DY from the optical axis. Here, DX=DY. The light thus collected in the vicinity of the stop 7 serves to produce secondary light sources.

Figure 5:
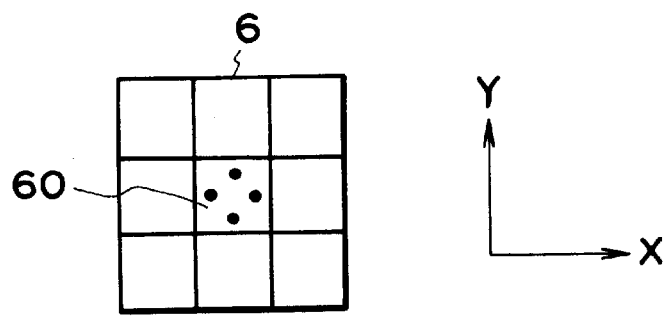
FIG. 5 is a schematic view for explaining points of convergence of lights upon the surface of a stop 7.

Thus, as regards the point of light convergence, the light being incident while satisfying equation (1), is collected at the same distance, with respect to the X-Y direction, from the center of each element as defined by the intersecting cylindrical lenses, as viewed in the Z direction. FIG. 5 shows the optical integrator 6 as viewed in the Z direction, and it illustrates the positions of light convergence points of lights having been collected upon the stop 7 surface. In FIG. 5, the convergence points (light source images) as produced by one element 60, which is defined by intersection of four cylindrical lenses $6a_0$, $6b_0$, $6c_0$ and $6d_0$ as viewed in the Z direction, are symmetric with respect to the X and Y directions. Even in the case where the reticle R is illuminated with an oblong shape (longer side A and shorter side B) as in FIGS. 1 and 2, any difference between the X and Y directions of the secondary light sources can be avoided by projecting the light, from the light source, onto the optical integrator 6 while satisfying equation (1)

As described above, this embodiment provides an illumination system for illuminating an oblong region with light from a light source, wherein an optical integrator 6 constituted by plural lens assemblies 6a–6c having different refractive powers, being different in dependence upon the direction, is used and wherein the lens assemblies constituting the optical integrator are so arranged that the outside shape of each element as defined by superposition of the lenses, when the lens assemblies are projected in the optical axis direction, is substantially the same with respect to the X and Y directions (Xa=Ya). As a result, each element 60 of the optical integrator has an approximately square shape. This assures that the secondary light sources have a substantially even pitch with respect to the X and Y directions.

Further, in this embodiment, when the largest incidence angles, in the X and Y directions, of the lights incident upon the optical integrator 6 are $\theta_1$ and $\theta_2$ respectively, and the focal lengths of the optical integrator in the X and Y directions are $f_1$ and $f_2$ (i.e., refractive powers in the X and Y directions are $\phi_1$ and $\phi_2$), the condition of equation (1) is satisfied.

As described, the tangential ratio of the largest incidence angles $\theta_1$ and $\theta_2$ is made substantially the same as the ratio between the refractive powers in the X and Y directions. As a result, there occurs no difference, with the direction, in the shape of the secondary light source images within a single element.

Consequently, in regard to the X and Y directions, the secondary light sources have the same pitch and, within a single element, there is no difference in the shape of the light source. Therefore, in the whole optical integrator, the difference in the secondary light sources with respect to the X and Y directions is avoided.

Figure 6:
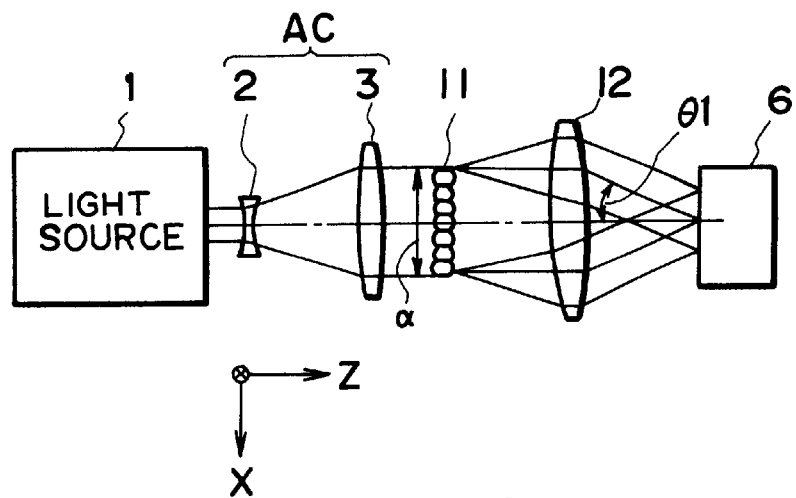
FIG. 6 is a schematic view, along an X-Z section, of a projection exposure apparatus with an illumination system according to a second embodiment of the present invention.
Figure 7:
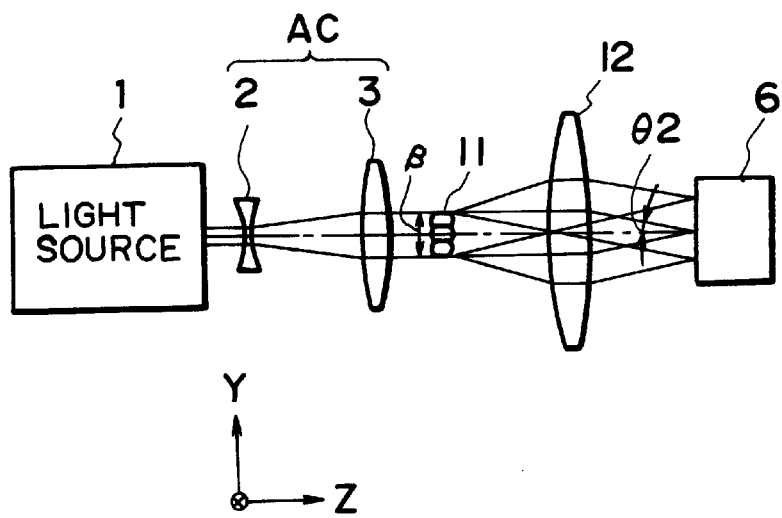
FIG. 7 is a schematic view, along a Y-Z section, of the projection exposure apparatus with the illumination system according to the second embodiment of the present invention.

FIGS. 6 and 7 are schematic views, along the X-Z plane and Y-Z plane, respectively, of a main portion of a projection exposure apparatus with an illumination system according to a second embodiment of the present invention. FIGS. 6 and 7 show light paths from a light source 1 to an optical integrator 6 which comprises combinations of cylindrical lenses, like the first embodiment.

Denoted at 1 is a light source which comprises an excimer laser and which produces parallel light of a rectangular sectional shape. The light from the light source 1 is expanded, to a predetermined size, by means of an afocal converter AC which comprises a concave lens 2 and a convex lens 3. The light is then projected on a fly's eye lens 11 having lenses arrayed in a rectangular shape, with the number of lenses in the X direction being different from that in the Y direction. Here, the fly's eye lens 11 comprises an assembly of small lens elements having spherical lens surfaces. The size thereof is α on the X-Z plane of FIG. 6, and is β on the Y-Z plane. The light incident on the fly's eye lens 11 serves to define secondary light sources at the light exit surface thereof. The light thus forming secondary light sources in the vicinity of the light exit surface of the fly's eye lens 11 is then projected by a lens 12 upon an optical integrator 6, for defining third light sources, at an incidence angle $\theta_1$ in FIG. 6 and $\theta_2$ in FIG. 7. Here, if the focal lengths (refractive powers) of the optical integrator 6 with respect to the X-Z plane and Y-Z plane are $f_1$ and $f_2$ ($\phi_1$ and $\phi_2$), respectively, the incidence angles $\theta_1$ and $\theta_2$ satisfy the condition of equation (1) (equation (1a)).

Also, the sizes α and β of the outside shape of the fly's eye lens 11 satisfy the following relation:

$$0.8 < [(\alpha/\beta)/(\phi_1/\phi_1)] < 1.2 \quad (2)$$

Also, in accordance with this embodiment, the light source image, as defined at the light exit surface of the optical integrator as the third light source, has a distribution without any difference with respect to the X and Y directions.

Figure 8:
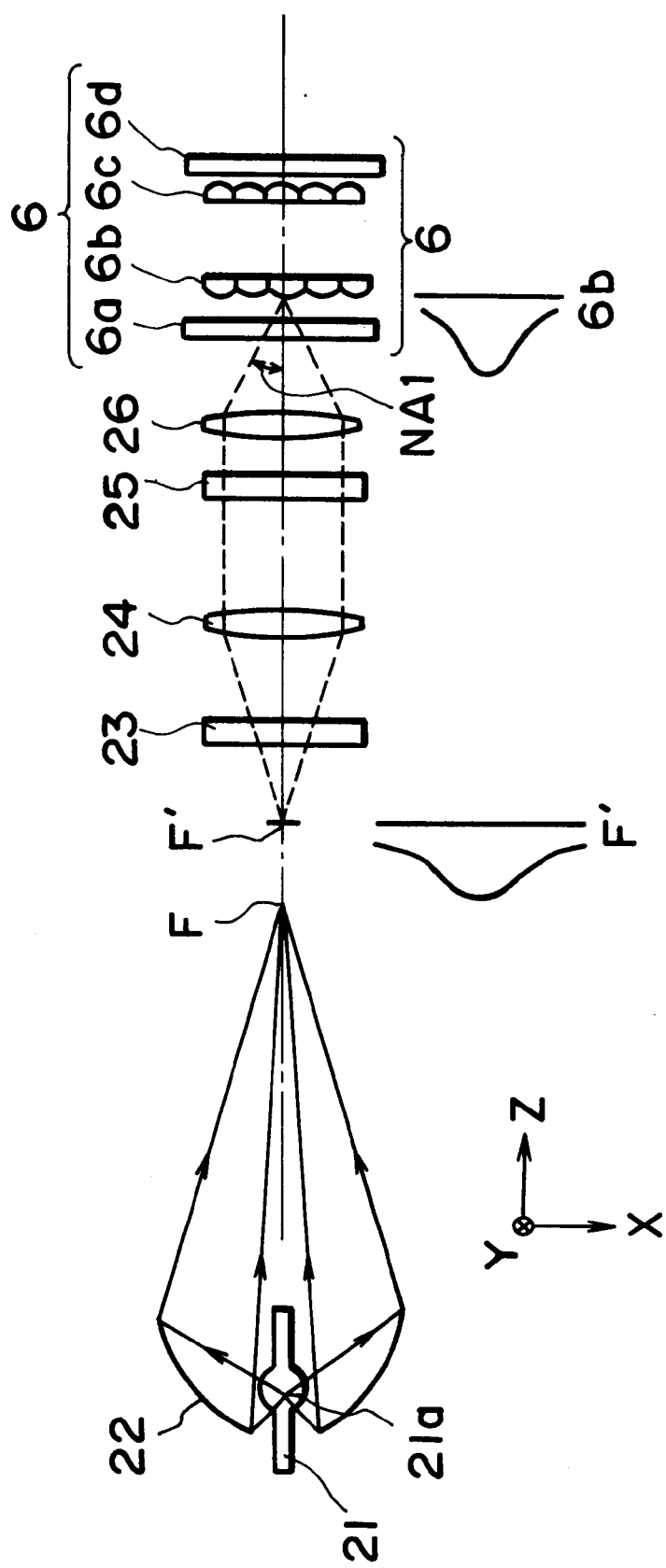
FIG. 8 is a schematic view, along an X-Z section, of a projection exposure apparatus with an illumination system according to a third embodiment of the present invention.
Figure 9:
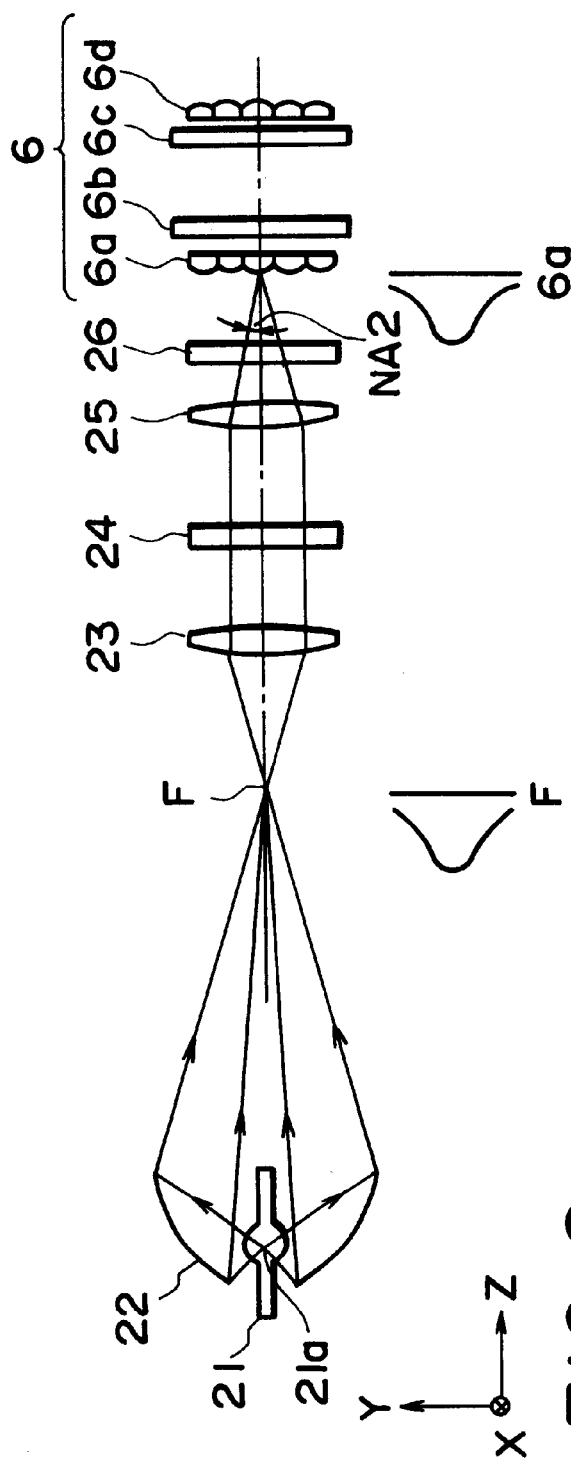
FIG. 9 is a schematic view, along a Y-Z section, of the projection exposure apparatus with the illumination system according to the third embodiment of the present invention.

FIGS. 8 and 9 are schematic views, along the X-Z plane and Y-Z plane, respectively, of a main portion of a projection exposure apparatus with an illumination system according to a third embodiment of the present invention. In FIGS. 8 and 9, denoted at 21 is a light source which comprises a super high pressure Hg lamp, for example. The light source 21 is arranged so that its arc portion 21a with highest luminance is disposed at a first focal point position of an elliptical mirror (reflecting member) 22. Divergent light from the light source 21 is collected by this elliptical mirror 22 at a second focal point position F. The light being converged in the vicinity of the second focal point position F by the elliptical mirror 22, is collected, with respect to the Y-Z plane of FIG. 9, onto an optical integrator 6 by means of cylindrical lenses 23, 24, 25 and 26. Here, the cylindrical lenses 24 and 26 have a refractive power in the X-Z plane (X direction), while the cylindrical lenses 23 and 25 have a refractive power in the Y-Z plane (Y direction). The optical integrator 6 comprises four cylindrical lens assemblies (lens assembly) 6a, 6b, 6c and 6d, like those in FIGS. 1 and 2.

In FIG. 8, the cylindrical lenses 24 and 26 function to image the position F', which is at a predetermined distance from the second focal point position F along the optical axis direction, upon the light entrance surface of the cylindrical lens assembly 6b with a predetermined magnification $\beta_1$.

Here, as regards the numerical aperture (NA) of the light projected on the optical integrator 6, it is $NA_1$ with respect to the X-Z plane of FIG. 8 while it is $NA_2$ with respect to the Y-Z plane of FIG. 9. When the focal length (refractive power) of the cylindrical lens assemblies 6b and 6c is $f_1$ ($\phi_1$) and the focal length (refractive power) of the cylindrical lenses 6a and 6d is $f_2$ ($\phi_2$), the following relation is satisfied:

$$0.8 < [(NA_1/NA_2)/(\phi_1/\phi_2)] < 1.2 \quad (3)$$

By projecting light onto the optical integrator 6 in accordance with the condition of equation (3), there is produced a light source image without a difference with respect to the X and Y directions, upon the light exit surface where the secondary light source is defined.

Further, in order that the same light quantity distribution is provided on the light entrance surfaces of the cylindrical lens assemblies 6a and 6b, in regard to the X-Z plane of FIG. 8 and in consideration of the imaging magnification of the cylindrical lenses 23, 24, 25 and 26, the position F' where a light quantity distribution wider than the light quantity distribution at the second focal point position F of the elliptical mirror 22 can be provided, is imaged upon the light entrance surface of the cylindrical lens assembly 6b.

Figure 10:
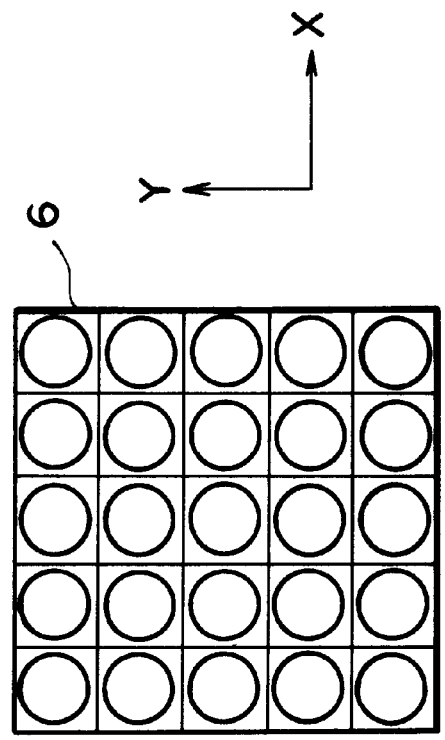
FIG. 10 is a schematic view for explaining a distribution of secondary light sources, in the projection exposure apparatus with the illumination system according to the third embodiment of the present invention.

FIG. 10 shows a distribution of secondary light sources in a projection exposure apparatus with the structure according to the third embodiment.

As shown in FIG. 10, the secondary light source images as produced by elements which are provided by the intersection of the cylindrical lenses of the optical integrator 6, have no difference with respect to the X and Y directions.

In the first to third embodiments as described above, the optical integrator comprises plural cylindrical lens assemblies (lens combinations). However, any other structure may be used, provided that different refractive powers being different with respect to the orthogonal directions may be produced. For example, a fly's eye lens having an ordinary spherical lens and a cylindrical lens in combination may be used. Alternatively, a fly's eye lens with a toric surface may be used.

Next, an embodiment of a semiconductor device manufacturing method which uses a projection exposure apparatus such as described above, will be explained.

Figure 11:
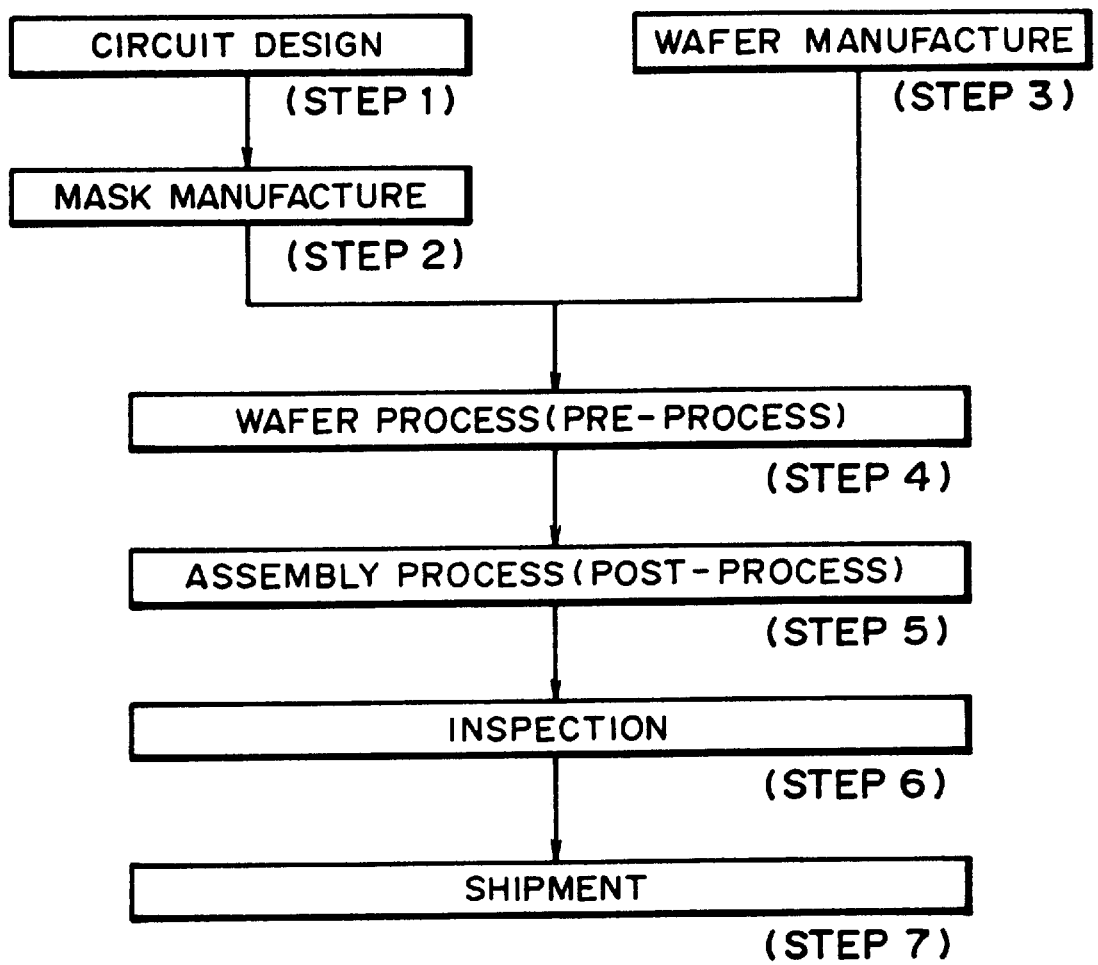
FIG. 11 is a flow chart of a device manufacturing method according to an embodiment of the present invention.

FIG. 11 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 12:
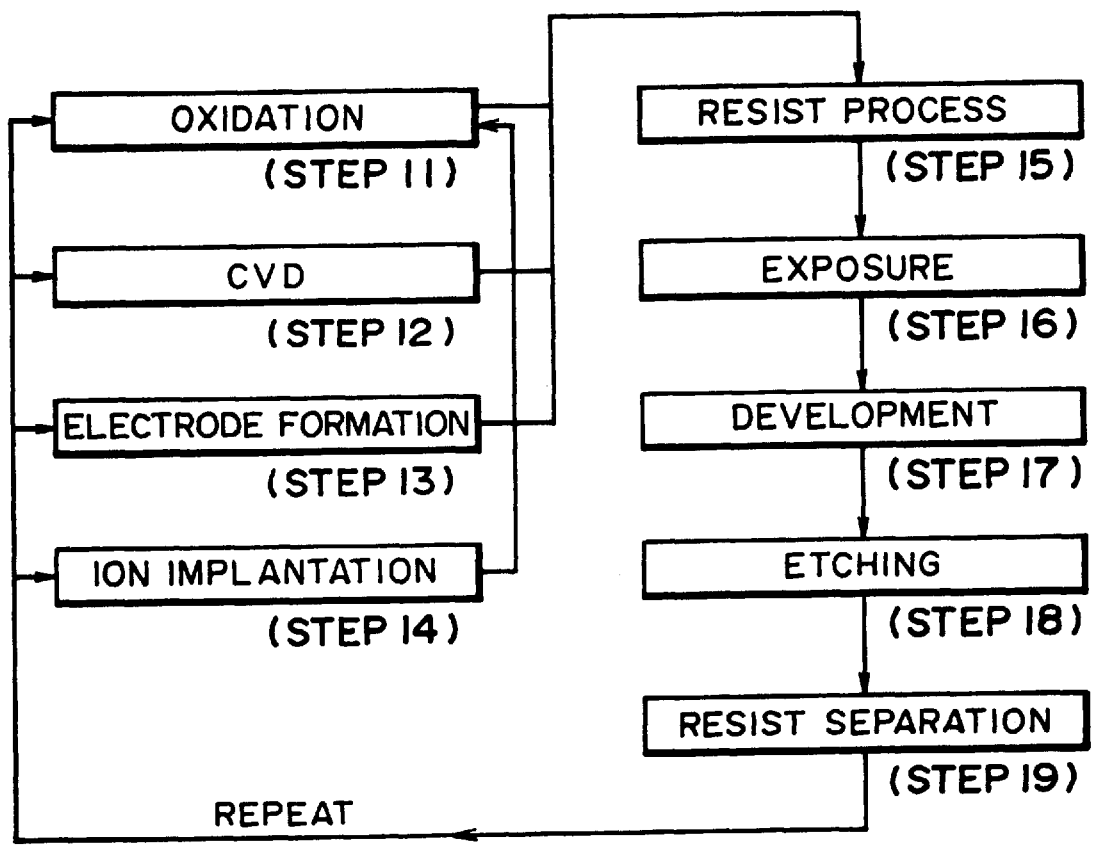
FIG. 12 is a flow chart of a procedure in a portion of the flow chart of FIG. 11.
Figure 13A:
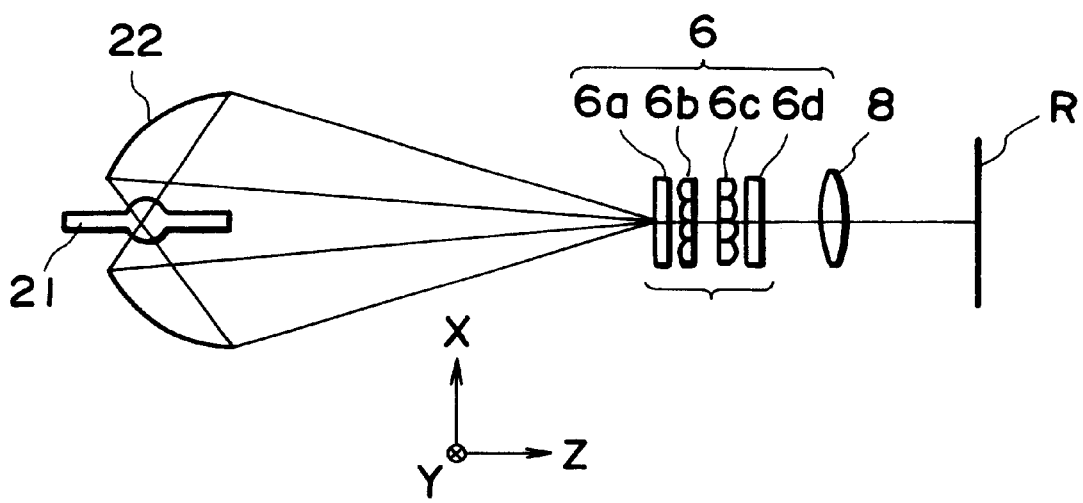
FIGS. 13A and 13B are schematic views, respectively, for explaining a known type illumination system.
Figure 13B:
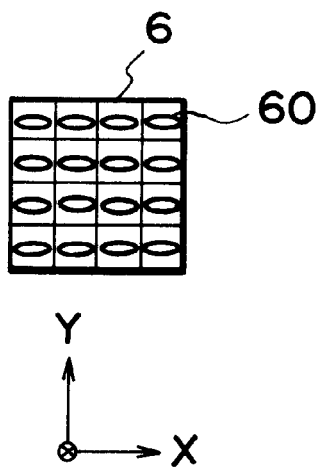

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

As described above, an optical integrator with an appropriate structure is used in a portion of an illumination system, by which it is assured that the pitch of the secondary light source images is even with respect to a first direction and a second direction perpendicular to the first direction. Also, it is assured that there is no difference in shape of the secondary light source images with respect to these directions. Thus, efficient utilization of light upon the surface to be illuminated is enabled while, on the other hand, illumination with a desired light intensity distribution is assured. When a reticle is placed at the surface to be illuminated, a pattern of the reticle can be illuminated appropriately, and high resolution can be provided easily. Thus, the present invention provides an illumination system and a projection exposure apparatus with the same, which is particularly suitable for the manufacture of devices such as semiconductor devices.

While the invention has been described with reference to the structures disclosed herein, it is not confined to the details set forth and this application is intended to cover such modifications or changes as may come within the purposes of the improvements or the scope of the following claims.

What is claimed is:

1. An illumination system for illuminating an illumination region having a difference in size along a first direction and a second direction perpendicular to the first direction, said illumination system comprising:

an optical integrator including elements having different refractive powers with respect to the first and second directions as the optical integrator is viewed in an optical axis direction, said elements also having the same pitch with respect to the first and second directions; and optical means for directing light from a light source upon said optical integrator, at different largest incidence angles with respect to the first and second directions, so as to satisfy a relation $$0.8 < [(\tan\theta_1/\tan\theta_2)/(\phi_1/\phi_2)] < 2.1$$

where $\theta_1$ and $\theta_2$ are largest incidence angles of the light incident on said optical integrator with respect to the first and second directions, and $\phi_1$ and $\phi_2$ are refractive powers of said optical integrator with respect to the first and second directions.

2. An illumination system according to claim 1, wherein said optical integrator comprises (i) a first lens assembly including lenses arrayed at a predetermined pitch, said lenses of said first lens assembly having different refractive powers being different with respect to the first and second directions, (ii) a second lens assembly including lenses arrayed at a predetermined pitch, said lenses of said second lens assembly having different refractive powers being different with respect to the first and second directions, wherein said first and second lens assemblies are disposed along the optical axis direction, and said elements are defined by an intersection of said lenses of said first and second lens assemblies as said first and second lens assemblies are viewed in the optical axis direction.

3. An illumination system according to claim 2, wherein said lenses of said first lens assembly comprise cylindrical lenses disposed along the first direction and having a refractive power only with respect to the first direction, and said lenses of said second lens assembly comprise cylindrical lenses disposed along the second direction and having a refractive power only with respect to the second direction.

4. An illumination system according to claim 2, wherein said optical integrator further comprises a plurality of first lens assemblies each corresponding to said first lens assembly, and a plurality of second lens assemblies each corresponding to said second lens assembly.

5. An illumination system according to claim 1, further comprising light dividing means for dividing the light from the light source, wherein light beam split by said light dividing means are incident on said optical integrator with a largest incidence angle $\theta_1$ with respect to the first direction and a largest incidence angle $\theta_2$ with respect to the second direction.

6. An illumination system according to claim 1, further comprising a fly's eye lens having lenses arrayed two-dimensionally, said fly's eye lens being disposed between the light source and said optical integrator, for defining plural light sources adjacent to a light exit surface thereof.

7. An illumination system according to claim 6, wherein said illumination system satisfies a relation $$0.8 < [(\alpha/\beta)/(\phi_1/\phi_2)] < 1.2$$

where $\alpha$ and $\beta$ are lengths of said fly's eye lens with respect to the first and second directions, respectively.

8. An illumination system for illuminating an illumination region having a difference in size along a first direction and a second direction perpendicular to the first direction, said illumination system comprising:

an optical integrator including elements having different refractive powers with respect to the first and second directions as said optical integrator is viewed in an optical axis direction, said elements also having the same pitch with respect to the first and second directions; and optical means for directing light from a light source upon said optical integrator, at different numerical apertures with respect to the first and second directions, so as to satisfy a relation $$0.8 < [(NA_1/NA_2)/(\phi_1/\phi_2)] < 1.2$$

where $NA_1$ and $NA_2$ are numerical apertures of the light incident on said optical integrator with respect to the first and second directions, and $\phi_1$ and $\phi_2$ are refractive powers of said optical integrator with respect to the first and second directions.

9. An illumination system according to claim 8, wherein said optical integrator comprises (i) a first lens assembly including lenses arrayed at a predetermined pitch, said lenses of said first lens assembly having different refractive powers being different with respect to the first and second directions, (ii) a second lens assembly including lenses arrayed at a predetermined pitch, said lenses of said second lens assembly having different refractive powers being different with respect to the first and second directions, wherein said first and second lens assemblies are disposed along the optical axis direction, and said elements are defined by an intersection of said lenses of said first and second lens assemblies as said first and second lens assemblies are viewed in the optical axis direction.

10. An illumination system according to claim 9, wherein said lenses of said first lens assembly comprise cylindrical lenses disposed along the first direction and having a refractive power only with respect to the first direction, and said lenses of said second lens assembly comprise cylindrical lenses disposed along the second direction and having a refractive power only with respect to the second direction.

11. An illumination system according to claim 9, wherein said optical integrator further comprises a plurality of first lens assemblies each corresponding to said first lens assembly, and a plurality of second lens assemblies each corresponding to said second lens assembly.

12. An illumination system for illuminating an illumination region having a difference in size along a first direction and a second direction perpendicular to the first direction, said illumination system comprising:

an optical integrator for receiving light from a light source, said optical integrator having (i) a first lens assembly including cylindrical lenses arrayed at a predetermined pitch along the first direction, said cylindrical lenses of said first lens assembly having a refractive power only with respect to the first direction, and (ii) a second lens assembly including cylindrical lenses arrayed at a predetermined pitch along the second direction, said cylindrical lenses of said second lens assembly having a refractive power only with respect to the second direction, wherein said first and second lens assemblies are disposed along the optical axis direction and when said first and second lens assemblies are viewed in the optical axis direction, said cylindrical lenses of said first and second lens assemblies are mutually intersected to define plural elements having the same pitch with respect to the first and second directions; and optical means for directing light from a light source to said optical integrator, at different largest incidence angles with respect to the first and second directions, so as to satisfy a relation $$0.8 < [(\tan\theta_1/\tan\theta_2)/(\phi_1/\phi_2)] < 1.2$$

where $\theta_1$ and $\theta_2$ are largest incidence angles of the light incident on said optical integrator with respect to the first and second directions, and $\phi_1$ and $\phi_2$ are refractive powers of said optical integrator with respect to the first and second directions.

13. A projection exposure apparatus comprising:

an illumination system as recited in any one of claims 1–12; and a projection optical system for projecting a pattern of a first object as illuminated with said illumination system onto a second object.

14. A projection exposure apparatus according to claim 13, further comprising scanning means for scanning the first and second objects at a speed ratio corresponding to a projection magnification of said projection optical system.

15. A device manufacturing method, comprising the steps of:

applying a photosensitive material to a wafer;

projecting a pattern of reticle onto the wafer by use of a projection exposure apparatus as recited in claim 13, for exposure of wafer; and developing the exposed wafer.

* * * * *

UNITED STATES PATENT AND TRADEMARK OFFICE
CERTIFICATE OF CORRECTION

PATENT NO. : 6,285,440 B1
DATED : September 4, 2001
INVENTOR(S) : Kazuhiro Takahashi It is certified that error appears in the above-identified patent and that said Letters Patent is hereby corrected as shown below:

<u>Column 2,</u>
Line 26, "with" should read -- with respect to --.
Line 48, "$0.8<[(\tan\theta_1/\tan\theta_2)/(\phi_1/\phi_2)]<2.1$" should read -- $0.8<[(\tan\theta_1/\tan\theta_2)/(\phi_1/\phi_2)]<1.2$ --.

<u>Column 3,</u>
Line 1, "$0.8<[(\tan\theta_1/\tan\theta_2)/(\phi_1/\phi_2)]<2.1$" should read -- $0.8<[(\tan\theta_1/\tan\theta_2)/(\phi_1/\phi_2)]<1.2$ --.

<u>Column 4,</u>
Line 60, "the central light rays of them" should read -- their central light rays --.

<u>Column 5,</u>
Line 22, "are contributable" should read -- contribute --.

<u>Column 6,</u>
Line 22, "equation (1)" should read -- equation (1). --.

<u>Column 7,</u>
Line 52, "$NA_1$" should read -- $NA_1$ --.

<u>Column 9,</u>
Line 37, "$0.8<[(\tan\theta_1/\tan\theta_2)/(\phi_1/\phi_2)]<2.1$" should read -- $0.8<[(\tan\theta_1/\tan\theta_2)/(\phi_1/\phi_2)]<1.2$ --.

<u>Column 10,</u>
Line 5, "beam" should read -- beams --.

Signed and Sealed this

Fourteenth Day of May, 2002

Attest:

*Attesting Officer*

JAMES E. ROGAN
*Director of the United States Patent and Trademark Office*